United States Patent [19]

Kwasnick et al.

[11] Patent Number: 5,463,225
[45] Date of Patent: Oct. 31, 1995

[54] SOLID STATE RADIATION IMAGER WITH HIGH INTEGRITY BARRIER LAYER AND METHOD OF FABRICATING

[75] Inventors: Robert F. Kwasnick; Ching-Yeu Wei; Jack D. Kingsley, all of Schenectady, N.Y.

[73] Assignee: General Electric Company, Schenectady, N.Y.

[21] Appl. No.: 99,370

[22] Filed: Jul. 29, 1993

Related U.S. Application Data

[63] Continuation-in-part of Ser. No. 891,117, Jun. 1, 1992, Pat. No. 5,233,181.

[51] Int. Cl.⁶ ......................... H01L 31/055; H01L 27/146
[52] U.S. Cl. ............................................................ 250/370.11
[58] Field of Search ......................................... 250/370.11

[56] References Cited

U.S. PATENT DOCUMENTS

| | | | |
|---|---|---|---|
| 4,311,907 | 1/1982 | Takami et al. | 250/368 |
| 4,906,850 | 3/1990 | Beerlage | 250/370.09 |
| 4,982,095 | 1/1991 | Takahashi et al. | 250/367 |
| 5,187,369 | 2/1993 | Kingsley et al. | 250/370.11 |
| 5,233,181 | 8/1993 | Kwansnick et al. | 250/208.1 |

FOREIGN PATENT DOCUMENTS

| | | |
|---|---|---|
| 0257678 | 3/1988 | European Pat. Off. . |
| 9206501 | 4/1992 | European Pat. Off. . |
| 3829912 | 3/1989 | Germany . |
| 55-129782 | 10/1980 | Japan . |
| 59-122988 | 7/1984 | Japan . |
| 1-131496 | 5/1989 | Japan . |
| 5-152210 | 6/1993 | Japan . |

Primary Examiner—Constantine Hannaher
Attorney, Agent, or Firm—Donald S. Ingraham; Marvin Snyder

[57] ABSTRACT

A radiation imager includes a photosensor barrier layer disposed between an amorphous silicon photosensor array and the scintillator. The barrier layer includes two strata, the first stratum being silicon oxide disposed over the upper conductive layer of the photosensor array and the second stratum is silicon nitride that is disposed over the first stratum. The photosensor barrier layer has a shape that substantially conforms to the the shape of the underlying upper conductive layer and has a maximum thickness of about 3 microns. The silicon oxide and silicon nitride are deposited in a vapor deposition process at less than about 250° C. using tetraethoxysilane (TEOS) as the silicon source gas.

17 Claims, 1 Drawing Sheet

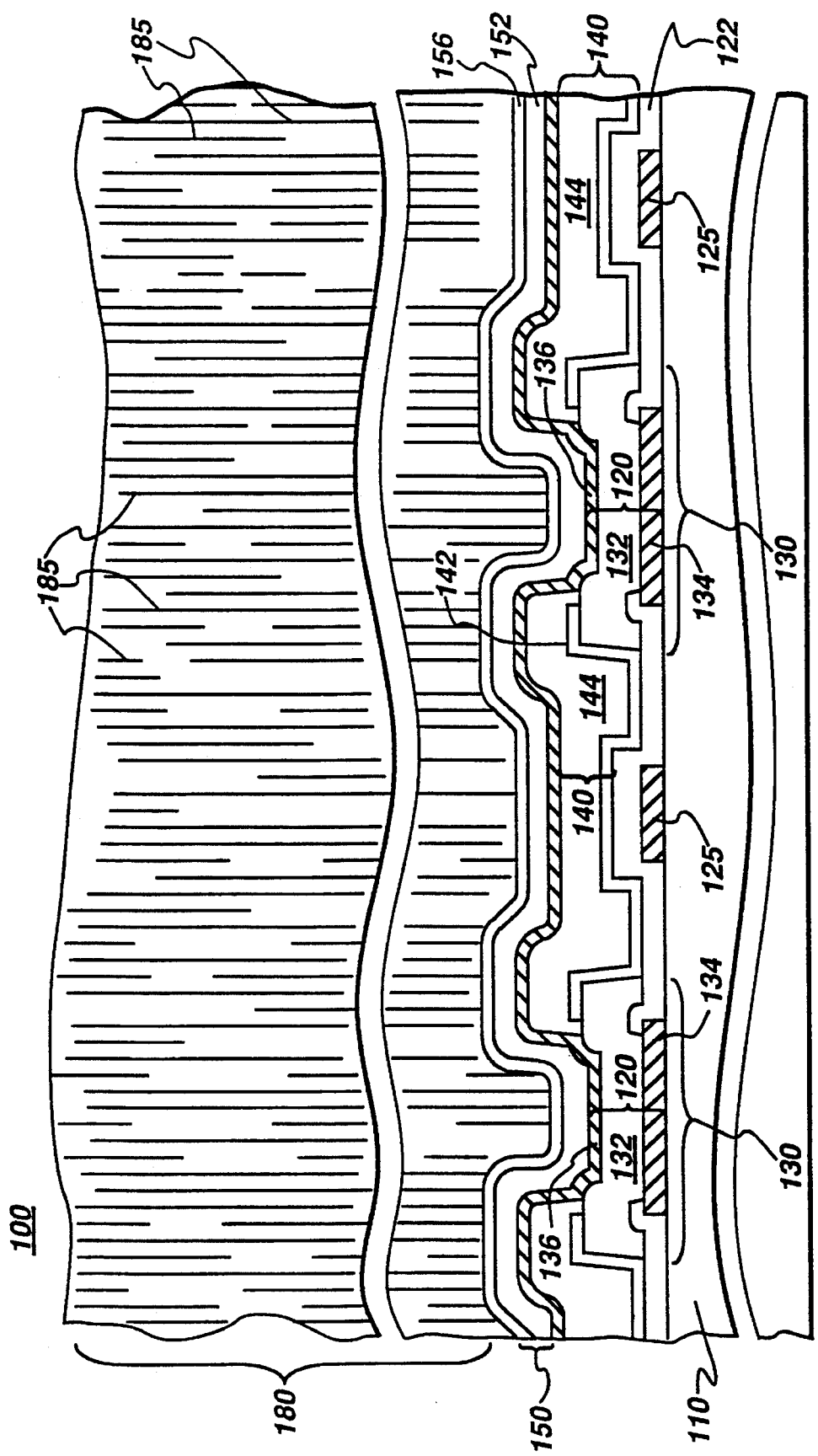

SOLID STATE RADIATION IMAGER WITH HIGH INTEGRITY BARRIER LAYER AND METHOD OF FABRICATING

RELATED APPLICATIONS

This application is a continuation-in-part of the application of R. F. Kwasnick and J. D. Kingsley entitled "Photosensitive Element with Two Layer Passivation Coating", Ser. No. 07/891,117 (RD-21,721), filed 1 Jun. 1992 now U.S. Pat. No. 5,233,181, which is assigned to the assignee of the present invention and incorporated herein by reference.

BACKGROUND OF THE INVENTION

Solid state imagers typically include a photosensor array coupled to a scintillating medium. Radiation absorbed in the scintillator generates optical photons which in turn pass into a photosensor, such as a photodiode, in which the optical photon is absorbed and an electrical signal corresponding to the incident optical photon flux is generated. Substantially hydrogenated amorphous silicon (a-Si) is commonly used in the fabrication of photosensors due to the advantageous photoelectric characteristics of a-Si and the relative ease of fabricating such devices. In particular, photosensitive elements, such as photodiodes, can be formed in connection with necessary control or switching elements, such as thin film transistors (TFT's), in a relatively large array. In such arrays both the TFT's and the photodiodes typically comprise a-Si.

The performance of amorphous silicon based imagers can be degraded by a number of factors, including, for example, exposure to moisture (which can cause the leakage of a-Si photodiodes to increase irreversibly), exposure to materials, such as solvents used in the fabrication process, that degrade the electrical characteristics of the a-Si photodiode or may damage the polymeric dielectric materials, or by exposure to temperatures higher than those of the a-Si deposition processes (e.g., greater than about 250° C.). It is thus beneficial to use fabrication processes that do not present adverse environmental conditions and to provide a protective boundary for a-Si components to minimize degradation both in fabrication and during operation of the imager. A protective boundary disposed between the a-Si components of the photosensor array and the scintillator in an imager desirably provides 1) protection of the photosensor array from contamination by the scintillating medium (and vice versa);2) a good surface to which the scintillator material can adhere;3) good optical coupling between the scintillator and the underlying pixels in the imager array (that is, a high degree of transmission of the optical photons with a minimum of scattering of the photons);and,4) a good environmental barrier to protect the photosensor array, especially from moisture.

In U.S. Pat. No. 4,906,850 to Beerlage, a thick layer of dielectric, such as silicon nitride or silicon oxide, is deposited over the photosensor array such that it can be patterned to form a number of islands on which a scintillator can be vapor deposited so that it grows up from the upper surfaces of these islands, In the Beerlage device, the grooves cut into the silicon oxide or silicon nitride layer to form the islands are about 10–20 μm wide and 10–20 μm deep, which necessarily implies that the overall protective layer is quite thick (i.e., greater than at least 10 μm). Similarly, the growing scintillator columns from such a large area (i.e., the relatively large top surface of the islands formed in the silicon oxide or silicon nitride) necessitates the use of a high-temperature scintillator deposition process (e.g., about 250° C.) that exposes the a-Si array components and the dielectric material to the same high temperatures. Thick silicon oxide or silicon nitride layers present other problems in imager arrays. For example, such thick layers are prone to crack (both vertically and horizontally), causing poor optical transmission characteristics, such as scattering of light caused by crack channels, and the thick layers are prone to delaminate, causing structural degradation of the imager.

It is thus an object of this invention to provide an imager array in which the a-Si components are protected from environmental elements, such as moisture.

It is a further object of this invention to provide an imager array having a high degree of protection from environmental elements and that is mechanically robust, providing good adhesion between the imager array and the scintillator.

It is a still further object of this invention to provide a method of fabricating an imager array to provide a protective layer and that minimizes exposure to the array to high temperatures in the fabrication process.

SUMMARY OF THE INVENTION

In accordance with this invention a solid state imager comprises a photosensor array, a scintillator optically coupled to the photosensor array, and a photosensor array barrier layer disposed therebetween. The photosensor barrier layer is disposed over the upper conductive layer of the photosensor array and is relatively thin, having a maximum thickness of less than about 3 μm or less, and a typical thickness of abut 1 μm. The shape of the array barrier layer conforms to the contour of the upper conductive layer and comprises silicon nitride. The array barrier layer typically comprises first and second strata (or layers), with the first stratum being disposed over the upper conductive layer of the photosensor array and comprising silicon oxide having a thickness in the range of between about 0.5 μm and 1.5 μm and the second stratum being disposed over the first stratum and having a thickness of between about 0.05 μm and 0.15 μm. In one embodiment of the present invention a passivation layer is disposed between the a-Si photosensor body and the upper conductive layer, the passivation layer comprising an inorganic moisture barrier layer and an organic dielectric layer.

A method of fabricating an imager array in accordance with this invention includes the steps of forming a photosensor array having an upper conductive layer and depositing a barrier layer over the photosensor array such that the barrier layer substantially conforms to the shape of the upper conductive layer and has a maximum thickness of about 3 μm. The step of forming the barrier layer further includes the step of depositing a first stratum of silicon oxide and a second stratum of silicon nitride thereover, the silicon oxide being deposited at a temperature less than about 250° C. The step of depositing the silicon oxide further includes the step of applying the silicon oxide using tetraethoxysilane (TEOS) as the silicon source gas.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which the sole FIGURE is a cross-sectional view of an imager array formed in accordance with one embodiment of the invention.

DETAILED DESCRIPTION OF THE INVENTION

A radiation imager 100 as illustrated in the FIGURE comprises a substrate 110 on which a photosensor array 120 is disposed, a scintillator 180 that is optically coupled to photosensor array 120, and, in accordance with this invention, a photosensor array barrier layer 150 disposed between photosensor array 120 and scintillator 180.

Photosensor array 120 comprises a plurality of photosensitive elements that are typically arranged in rows and columns on substrate 110. Alternatively, photosensor array 120 may be disposed over a dielectric layer (not shown) that covers substrate 110, as might be the case if other components are disposed on substrate 110 below the photosensor array. As used herein, "lower" or "bottom" are used interchangeably to refer to a relative position of a portion of imager array 100 closer in proximity to substrate 110, and "upper" or "top" are used interchangeably to refer to a relative position of a portion of imager array closer farther from substrate 110; no operational or functional limitation on the orientation of the imager array is implied. Each photosensitive element typically comprises a photodiode 130 comprising a photosensor island 132 disposed over a bottom contact pad 134 and with an upper conductive layer 136 disposed over the assembly. Upper conductive layer 136 comprises a substantially transparent conductive material such as indium tin oxide or the like.

Photosensor island 132 comprises light absorptive semiconductive material such as substantially intrinsic hydrogenated amorphous silicon (a-Si), and may comprise bands (not shown) of silicon doped to show a selected conductivity (i.e., n-type or p-type) to provide the desired respective electrical contact to bottom contact pad 134 and upper conductive layer 136. Photosensor island is disposed between upper conductive layer 136 and bottom contact pad 134 such that a selected bias voltage is applied across the photosensor body. Consequently, charge generated by the absorption of optical photons in the semiconductive material is collected at a selected electrode that is periodically "read" or measured, at which time the bias voltage across the photodiode is reset to its selected value.

Each photodiode 130 is coupled to circuitry to allow charge collected on the photodiode to be read. Typically each photodiode is selectively coupled to a data line 125 by a respective thin film transistor (not shown); a dielectric layer 127 typically overlies the plurality of TFT's and data lines and provide electrical insulation between these components and overlying components, such as photodiode 130.

Photosensor array 120 advantageously comprises a passivation layer 140 which is disposed under upper conductive layer 136 except at points where upper conductive layer 136 is disposed in electrical contact with the upper surface of photosensor island 132. Passivation layer 140 comprises an inorganic moisture barrier layer 142 and an organic dielectric layer 144. Inorganic layer 142 typically comprises silicon nitride and is relatively thin, between about 0.01 micron and 0.5 micron; organic dielectric layer 144 typically comprises a polyimide, preferably a preimidized polyimide such as the Ciba-Geigy® 200 series, and has a thickness between about 0.5 micron and 2.5 micron. Details pertaining to passivation layer appear in the U.S. Pat. No. 5,233,181, incorporated herein by reference.

In accordance with this invention, photosensor barrier layer 150 is conformably disposed over upper conductive layer 136 and has a maximum thickness of about 3 microns or less. As used herein, "conformably disposed," "conformal," or the like refers to photosensor barrier layer 150 having a shape that is substantially similar to the contour of upper conductive layer 136, such that passivation layer 150 is disposed on upper conductor 136 and has a substantially uniform thickness along its length. Scintillator 180 is disposed over barrier layer 150 and is optically coupled to photosensor array 120 through the barrier layer. Barder layer 150 is adapted to provide good optical coupling of photons between scintillator 180 and photosensor array 120 (that is, optical coupling with a high degree of transmission and with little or no scattering of the optical photons such as is provided by transparent dielectric materials without cracks). Barrier layer 150 is further adapted such that the scintillator material adheres well to the upper surface of barrier layer so that there is little or no mechanical deterioration of the bond between scintillator 180 and barrier layer 150 under normal operating conditions for the imager; e.g., the structure should pass the standard tape pull test (wherein the adhesive tape is applied to the structure and pulled off, as is known in the art) without delamination. Further, barrier layer 150 is relatively thin such that in normal operating environments in which imagers are used the barrier layer remains substantially crack free and does not delaminate. Commonly, barrier layer 150 has a thickness of about 1 µm.

Photosensor array barrier layer 150 typically comprises a first stratum (or layer) disposed adjacent to upper conductive layer 136 and a second stratum 156 disposed on first stratum 152, with scintillator 180 being disposed on second stratum 156. First stratum 152 comprises silicon oxide that has a typical thickness in a range between about 0.5 microns and 1.5 microns, and commonly has a thickness of about 0.7 microns. The silicon oxide comprising first stratum 152 is typically deposited in a plasma enhanced chemical vapor deposition (PECVD) process using tetraethoxysilane (TEOS) as the silicon source gas at a temperature of less than about 250° C., providing a silicon oxide having a composition of $SiO_x$, wherein $1.5 \leq x \leq 2$, and hydrogen content is less than about 5% of the atoms. Silicon oxide deposited in this process conforms well to the underlying layer (i.e., step coverage is good over the contours of upper conductive layer 136) even while maintaining a deposition temperature of about 210° C. Additionally, the silicon oxide provides a robust moisture barrier and is resistant to solvents, such as gamma butyrolactone, which may be present in the array from the deposition of polyimide.

Second stratum 156 comprises silicon nitride having a typical thickness in a range between about 0.05 µm and 0.15 µm, and commonly has a thickness of about 0.1 µm. The silicon nitride comprising second stratum is deposited in a PECVD process at a temperature of about 210° C., and typically at a reduced frequency of about 50 KHz (as opposed the more commonly used PECVD frequency of 13.56 MHz). This process provides silicon nitride having a composition of $SiN_y$, wherein $1.0 \leq y \leq 1.33$, and hydrogen content is less than about 10% of the atoms. The silicon nitride of second stratum 156 additionally provides a surface adapted to provide good adhesion to the scintillating medium deposited thereover.

In an alternative embodiment of this invention (not shown), photosensor barrier layer comprises only one stratum, which comprises silicon nitride. Such a layer typically has a thickness of between about 0.2 µm and 1 µm; except as noted herein, the device of the alternative embodiment is otherwise the same as that described elsewhere in the specification with respect to the two strata photosensor barrier layer device.

In the two strata barrier layer, typically the optical index of refraction of the silicon oxide first stratum is in the range between 1.4 and 1.5, and the optical index of refraction of the silicon nitride is in the range between about 1.8 and 2.3, and typically is about 2.0. Optical coupling between scintillator 180 and photosensor array 120 through two-strata barrier layer 150 has been measured to be comparable to the optical coupling achieved with a single layer of silicon nitride.

Scintillator 180 comprises a scintillating medium adapted to emit optical photons in response to the absorption of incident radiation of the type to be imaged; for example, for x-ray imagers, cesium iodide doped with thallium (CsI:Tl) is commonly used. The CsI:Tl is advantageously deposited on photosensor barrier layer 150 by evaporation in the form of needles 185; each needle is typically several microns in diameter and several hundred microns long. This aspect ratio in which the needle has a relatively long longitudinal axis compared to a relative short diameter provides a scintillator in which most optical photons emerge from the bottom of the scintillator (towards the photosensor array) such that they are efficiently optically coupled into the photosensor array; that is the majority of photons strike the photosensor barrier layer at sufficiently large angles of incidence so that substantially all photons pass into photosensor array 120 without being reflected at any of the following interfaces: between the scintillator material and the silicon nitride in second stratum 156; between the silicon nitride and the silicon oxide in first stratum 152; and between the silicon oxide and the upper conductive layer 136.

In accordance with this invention, in the fabrication process the silicon oxide and silicon nitride layers of photosensor barrier layer 150 may be deposited during the same vacuum pumpdown. It is further desirable to deposit the silicon oxide for first stratum 152 and the silicon nitride for second stratum 156 through a shadow mask to selectively deposit it only over the desired portion of upper conductive layer 136 so that the silicon oxide and silicon nitride are not deposited on areas, such as contact fingers, from which it must later may be removed in an etching process that may also result in the undesired removal of other layers of silicon oxide or silicon nitride forming portions of other components in imager array 100.

The process of forming a radiation imager in accordance with this invention includes the steps of forming a photosensor array on a substrate, the photosensor array having an upper conductive layer deposited thereover; depositing a photosensor barrier over the upper conductive layer such that, as noted above, the barrier layer conforms to the upper conductive layer and has a maximum thickness of about 3 µm or less. The barrier layer is formed from a first stratum comprising silicon oxide deposited at a temperature less than about 250° C. (typically about 210° C.) and using TEOS as the silicon source gas. The second stratum of silicon nitride is deposited over the first stratum in a PECVD process using a gas mixture of silane, ammonia, and nitrogen. The silicon oxide and silicon nitride are advantageously deposited during a single vacuum pumpdown of the array being fabricated, and TEOS is advantageously used as the silicon source gas for the silicon oxide. The step of forming a photosensor array advantageously comprises the steps of forming a plurality of amorphous silicon photosensitive bodies; forming a passivation layer over the plurality of photosensitive bodies, the passivation layer comprising an inorganic moisture barrier layer and an organic dielectric layer; and depositing the upper conductive layer over the passivation layer and the photosensitive bodies.

A radiation imager formed in accordance with this invention exhibits a robust structure that is resistant to mechanical degradation and that is resistant to attack by moisture. For example, a comparison of the increase in number of defective pixels in imager arrays operated in a high humidity environment (about 60–80% relative humidity (RH)) over a period up to 100 hours indicates that a photosensor array having a barrier layer fabricated in accordance with this invention (but with no scintillator disposed thereover) experienced much less degradation in this inhospitable operating environment than imagers without a barrier layer. Degradation was characterized by the number of new defective pixels that appeared in the array after exposure to the test environment, a defective pixel being one in which the leakage exceeded 1 pA with about 6 volts reverse bias across the photodiode.

The table below presents representative data from tests run with imager arrays having varying diode passivation and barrier layer schemes without scintillator coatings. Each array comprises 40,000 pixels (each having an area of about $4\times10^{-4} cm^2$) that were scanned with the photodiodes under reverse bias of about 8 volts to simulate operational conditions in high humidity (about 60–80% RH) at an ambient temperature of about 70° F.

Data for arrays having no photodiode passivation other than polyimide (PI) (designated "A–__"); having silicon nitride under the polyimide (designated "B–__"); having a two-strata barrier layer (designated "C–__"); and a single stratum barrier layer (designated "D–__") are presented:

| Imager | Diode Passivation: SiNy under PI | Barrier Layer | Scanning Time at 60–80% RH | Number of Additional Defective Pixels |
|---|---|---|---|---|
| A-1 | None | None | 38 hrs. | 280 |
| A-2 | None | None | 32 hrs. | 5021 |
| A-3 | None | None | 31 hrs. | 856 |
| B-1 | 1000 Å | None | 38 hrs. | 54 |
| B-2 | 1000 Å | None | 41 hrs. | 70 |
| C-1 | 1000 Å | 1350 Å $SiN_y$/ 7500 Å $SiO_x$ | 46 hrs. | 1 |
| C-2 | 1000 Å | 1350 Å $SiN_y$/ 7500 Å $SiO_x$ | 74 hrs. | 8* |
| C-3 | 1000 Å | 1350 Å $SiN_y$/ 7500 Å $SiO_x$ | 79 hrs. | 15** |
| D-1 | 1000 Å | 1350 Å $SiN_y$ | 39 hrs. | 58 |
| D-2 | 1000 Å | 1350 Å $SiN_y$ | 48 hrs. | 22 |
| D-3 | 1000 Å | 2750 Å $SiN_y$ | 46 hrs. | 8 |
| D-4 | 1000 Å | 4150 Å $SiN_y$ | 45 hrs. | 12 |
| D-5 | 1000 Å | 6950 Å $SiN_y$ | 49 hrs. | 5 |
| D-6 | 1000 Å | 6950 Å $SiN_y$ | 48 hrs. | 5 |

Notes to the Table:
*No data taken on lot C-2 in the 40–50 hour time frame.
**In lot C-3, after 94 hours and drying to obviate effects of moisture-mediated line-to-line leakage, 2 or less pixels were found to be degraded by the exposure to the high humidity environment. The number of defective pixels noted at 79 hours is therefor believed to result from moisture mediated line to line leakage as opposed to moisture penetration and degradation of the pixels.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A solid state imager comprising:

a photosensor array having an upper conductive layer disposed substantially thereover, said upper conductive layer having an undulating surface topography corresponding to the contour of the underlying photosensor array components;

a photosensor array barrier layer comprising a first stratum disposed over said upper conductive layer, and a second stratum disposed over said first stratum, said first stratum comprising silicon oxide and said second stratum comprising silicon nitride, said barrier layer having a shape conforming to the underlying conductive layer and having a maximum thickness of less than about 3 μm; and a scintillator disposed over said photosensor array barrier layer and optically coupled to said photosensor array through said barrier layer;

said first stratum providing a robust moisture barrier and said second stratum providing an adhesion bonding surface for said scintillator.

2. The imager of claim 1 wherein said photosensor array comprises amorphous silicon.

3. The imager of claim 1 wherein the thickness of said silicon oxide layer is in the range between about 0.5 μm and 1.5 μm.

4. The imager of claim 1 wherein the thickness of said silicon nitride layer is in the range between about 0.05 μm and 0.15 μm.

5. The imager of claim 1 wherein said photosensor array comprises a plurality of photosensor bodies and a passivation layer disposed between said upper conductive layer and each respective photosensor body, said passivation layer comprising an inorganic moisture barrier layer and an organic dielectric layer.

6. The imager of claim 5 wherein said inorganic moisture barrier layer comprises silicon nitride and said organic dielectric layer comprises polyimide.

7. The imager of claim 1 wherein the thickness of said barrier layer is not greater than about 1 μm.

8. The imager of claim 1 wherein said upper conductive layer comprises indium tin oxide.

9. The imager of claim 1 wherein said silicon oxide in said first stratum comprises $SiO_x$, wherein $1.5 \leq x \leq 2$.

10. The imager of claim 1 wherein said silicon nitride in said second stratum comprises $SiN_y$, wherein $1 \leq y \leq 1.33$.

11. The imager of claim 1 wherein said silicon oxide in said first stratum has an optical index of refraction between about 1.4 and 1.5.

12. The imager of claim 1 wherein said silicon nitride in said second stratum has an optical index of refraction between about 1.8 and 2.3.

13. The imager of claim 1 wherein said scintillator comprises cesium iodide, said cesium iodide being disposed in a plurality of needle-shaped structures disposed over said upper conductive layer.

14. A radiation imager for detecting optical photons generated by absorption of incident x-rays, comprising:

a photosensor array having a plurality of amorphous silicon photosensitive bodies disposed on a substrate and an upper conductive layer disposed thereover, said array further comprising a passivation layer disposed between said upper conductive layer and said plurality of photosensitive bodies, said passivation layer comprising an inorganic moisture barrier layer and an organic dielectric layer;

a needle-structure scintillator optically coupled to said photosensor array such that optical photons generated in said scintillator pass into said photosensor array; and a photosensor array barrier layer conformably disposed between said photosensor array and said scintillator, said array barrier layer having a maximum thickness less than about 3 μm and being adapted to be substantially impervious to moisture and optically non-diffusive;

said array barrier layer comprising a first and a second stratum, said first stratum of said array barrier layer being disposed adjacent to said upper conductive layer and said second stratum is disposed thereover, said first stratum comprising silicon oxide and said second stratum comprising silicon nitride.

15. The radiation imager of claim 14 wherein said first stratum has a thickness in the range between about 0.5 μm and 1.5 μm.

16. The radiation imager of claim 15 wherein said second stratum has a thickness in the range between about 0.05 μm and 0.15 μm.

17. The radiation imager of claim 16 wherein said upper conductive layer comprises indium tin oxide.

* * * * *

UNITED STATES PATENT AND TRADEMARK OFFICE
CERTIFICATE OF CORRECTION

PATENT NO. : 5,463,225

DATED : October 31, 1995

INVENTOR(S) : Robert F. Kwasnick et al.

It is certified that error appears in the above-identified patent and that said Letters Patent is hereby corrected as shown below:

Title should read as follows: SOLID STATE RADIATION IMAGER WITH HIGH INTEGRITY BARRIER LAYER Signed and Sealed this Twenty-sixth Day of March, 1996

Attest:

BRUCE LEHMAN

*Attesting Officer*     *Commissioner of Patents and Trademarks*